United States Patent
Gardner et al.

[19]

[11] Patent Number: 5,989,967
[45] Date of Patent: Nov. 23, 1999

[54] TRANSISTOR WITH ULTRA SHORT LENGTH DEFINED PARTIALLY BY SIDEWALL OXIDATION OF A GATE CONDUCTOR OVERLYING THE CHANNEL LENGTH

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 09/070,256

[22] Filed: Apr. 30, 1998

[51] Int. Cl.$^6$ .................................................. H01L 21/265
[52] U.S. Cl. ..................... 438/305; 438/303; 438/304; 438/265; 438/286; 257/344
[58] Field of Search ................................ 438/303, 304, 438/305, 265, 286; 257/344

[56] References Cited

U.S. PATENT DOCUMENTS

| | | | |
|---|---|---|---|
| 5,472,895 | 12/1995 | Park ........................................ | 438/305 |
| 5,578,509 | 11/1996 | Fujita ..................................... | 438/286 |
| 5,672,531 | 9/1997 | Gardner et al. ......................... | 438/286 |
| 5,693,546 | 12/1997 | Nam et al. .............................. | 438/305 |
| 5,710,450 | 1/1998 | Chau et al. ............................. | 438/303 |
| 5,783,473 | 6/1998 | Sung ...................................... | 438/265 |

OTHER PUBLICATIONS

Stanley Wolf Silicon Processing for the VSLI Era vol. I Lattice Press pp. 182,191,192, 1986.

*Primary Examiner*—Charles Bowers
*Assistant Examiner*—David S Blum
*Attorney, Agent, or Firm*—Kevin L. Daffer; Conley, Rose & Tayon

[57] ABSTRACT

An integrated circuit fabrication process is provided for forming a transistor having an ultra short channel length. A mask is formed, from a material resistant to oxidation, upon a conductive gate layer and portions of the conductive gate layer are oxidized to form a gate conductor laterally disposed between a pair of oxide regions. As a result, the gate conductor has an ultra narrow lateral dimension. Source and drain impurity areas are formed self-aligned with sidewall surfaces of the oxide regions. In an embodiment, the oxide regions are removed and lightly doped drain regions are formed self-aligned with sidewall surfaces of the gate conductor. Following LDD formation, the mask is removed, spacers are formed laterally adjacent the gate conductor sidewall surfaces, and a metal silicide is formed upon upper surfaces of the gate conductor and the source and drain impurity areas. In an alternative embodiment, following formation of the source and drain impurity areas, the mask is removed and the oxide regions are etched to form sidewall spacers adjacent the gate conductor. Lightly doped drain implant areas are then formed self-aligned to sidewall surfaces of the gate conductor, and a metal silicide is formed upon upper surfaces of the gate conductor and the source and drain impurity areas.

26 Claims, 4 Drawing Sheets

TRANSISTOR WITH ULTRA SHORT LENGTH DEFINED PARTIALLY BY SIDEWALL OXIDATION OF A GATE CONDUCTOR OVERLYING THE CHANNEL LENGTH

BACKGROUND OF THE INVENTION

1. Field of the Invention

This invention relates to a transistor having a scalable channel length and a method for making the same. An oxidation process may be used to form, from a gate conductive material, oxide regions laterally adjacent a gate conductor. By controlling the duration of the oxidation, transistors having a desired channel length (e.g., less than 0.25 micron) may be accurately fabricated. In addition, the method described herein may be used to reproducibly fabricate transistors having a desired channel length both across a semiconductor substrate and between semiconductor wafers.

2. Description of the Related Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source/drain regions (i.e., junctions) adjacent to and on opposite sides of the gate conductor within the substrate. The gate conductor and source/drain regions are then implanted with an impurity dopant. If the dopant species employed for forming the source/drain regions is n-type, then the resulting MOSFET is an NMOSFET (n-channel) transistor device. Conversely, if the source/drain dopant species is p-type, then the resulting MOSFET is a PMOSFET (p-channel) transistor device. Integrated circuits utilize either n-channel devices exclusively, p-channel devices exclusively, or a combination of both on a single monolithic substrate.

Because of the increased desire to build faster and more complex integrated circuits, it has become necessary to reduce the transistor threshold voltage, VT. Several factors contribute to $V_T$, one of which is the effective channel length ("$L_{eff}$") of the transistor. The initial distance between the source-side junction and the drain-side junction of a transistor is often referred to as the physical channel length. However, after implantation and subsequent diffusion of the junctions, the actual distance between junctions becomes less than the physical channel length and is often referred to as the effective channel length. In VLSI designs, as the physical channel length decreases, so too must the $L_{eff}$. Decreasing $L_{eff}$ reduces the distance between the depletion regions associated with the source and drain of a transistor. As a result, less gate charge is required to invert the channel of a transistor having a shorter $L_{eff}$. Accordingly, reducing the physical channel length, and hence the $L_{eff}$, can lead to a reduction in the threshold voltage of a transistor. Consequently, the switching speed of the logic gates of an integrated circuit employing transistors with reduced $L_{eff}$ is faster, allowing the integrated circuit to quickly transition between logic states (i.e., operate at high frequencies).

Unfortunately, minimizing the physical channel length of a transistor is somewhat limited by conventional techniques used to define the gate conductor of the transistor. As mentioned earlier, the gate conductor is typically formed from a polysilicon material. A technique known as lithography is used to pattern a photosensitive film (i.e., photoresist) above the polysilicon material. An optical image is transferred to the photoresist by projecting a form of radiation, typically ultraviolet light, through the transparent portions of a mask plate. The solubility of photoresist regions exposed to the radiation is altered by a photochemical reaction. The photoresist is washed with a solvent that preferentially removes resist areas of higher solubility. Exposed portions of the polysilicon material not protected by photoresist are etched away, defining the geometric shape of a polysilicon gate conductor.

The lateral width (i.e., the distance between opposed sidewall surfaces) of the gate conductor, which dictates the physical channel length of a transistor, is thus defined by the lateral width of an overlying photoresist layer. The minimum lateral dimension that can be achieved for a patterned photoresist layer is unfortunately limited by, inter alia, the resolution of the optical system (i.e., aligner or printer) used to project the image onto the photoresist. The term "resolution" describes the ability of an optical system to distinguish closely spaced objects. Diffraction effects may undesirably occur as the radiation passes through slit-like transparent regions of the mask plate, scattering the radiation and therefore adversely affecting the resolution of the optical system. As such, the features patterned upon a masking plate may be skewed, enlarged, shortened, or otherwise incorrectly printed onto the photoresist.

In most core logic areas of an integrated circuit there are numerous logic gates, e.g., NAND and NOR gates, and interconnection between those gates. While reducing the $L_{eff}$ of each gate conductor within a logic gate increases the operational frequency and the integration density of an integrated circuit, other factors must also be manipulated to maximize circuit complexity and speed. For example, the spacing between series-connected transistors within a multiple-input logic gate must be decreased to provide for high packing density and high-speed operation of the logic gate. Unfortunately, the minimum definable dimension of lithography mandates the spacing between the gate conductors. The geometric shape of the gate conductors is generally defined by lithographically patterning photoresist over regions of a gate conductor material to be retained for the gate conductors. The minimum distance between portions of the photoresist patterned over the gate conductor material is limited by the constraints of lithography. Therefore, the lateral width of each region of the gate conductor material etched to form the gate conductors cannot be reduced below, e.g., 0.2 micron. As such, the minimum spacing between gate conductors within a logic gate is sacrificed by the conventional procedure of using lithography to pattern the gate conductors.

It would therefore be desirable to develop a transistor fabrication technique in which the channel length of the transistor is reduced to provide for high-frequency operation of an integrated circuit employing the transistor. More specifically, a process is needed in which the channel length is no longer dictated by the resolution of a lithography optical aligner. The lateral width of a gate conductor that defines the channel length of a transistor must no longer be determined by an image printed onto photoresist. Otherwise, the image could be altered during optical lithography, resulting in the dimensions of the gate conductor being altered from design specifications. A process which avoids the limitations of lithographic exposure used for defining opposed sidewall surfaces (i.e., boundaries) of conventional gate conductors would beneficially allow the channel length, and hence the $L_{eff}$, of a transistor to be scaled with higher resolution and potentially to a smaller size. Minimizing and/or providing accurate control over $L_{eff}$ of a transistor would advantageously allow a designer to more closely design for specified operational parameters, such as speed at which the transistor switches between its on and off states.

SUMMARY OF THE INVENTION

The problems outlined above are in large part solved by the technique hereof for fabricating a transistor in which a mask is used to pattern a gate conductor having an ultra short lateral dimension. First and second dielectric layers may be formed sequentially upon a semiconductor substrate. Preferably, the first and second dielectric layers exhibit dissimilar etch characteristics, such that the second dielectric layer may be removed without substantially removing the first dielectric layer. In an embodiment, the first dielectric layer includes silicon dioxide and the second dielectric layer includes silicon nitride. A conductive gate material may then be formed upon the second dielectric layer. In an embodiment, the conductive gate material includes polycrystalline silicon ("polysilicon") chemical-vapor deposited from, e.g., a silane source.

A masking layer may be formed upon the conductive gate material. Preferably, the masking layer exhibits etch characteristics similar to those of the second dielectric layer. That is, an etch that selectively removes the second dielectric layer from upon the first dielectric layer preferably also will remove the masking layer from upon the conductive gate material. For example, both the masking layer and the second dielectric layer may include silicon nitride. Alternatively, in an embodiment in which the second dielectric layer is silicon nitride, the masking layer may include any dielectric material having a dielectric constant K greater than the K value of silicon dioxide.

A photoresist may be deposited upon the masking layer using, e.g., chemical vapor deposition and then selectively patterned and removed from above portions of the masking material. Portions of the masking layer and the underlying conductive gate material not masked by the remaining photoresist may be removed using, e.g., an anisotropic dry plasma etch to form a mask upon a gate structure.

Subsequently, the gate structure may be thermally oxidized to form a gate conductor laterally displaced between a pair of oxide regions. Preferably, the mask substantially prevents oxidation at an upper surface of the gate conductor, such that the oxide regions are formed only through oxidation occurring adjacent sidewall surfaces of the gate conductor and not upon an upper surface of the gate conductor. Following formation of the oxide regions, a first impurity distribution may be introduced into the semiconductor substrate self-aligned with outer sidewall surfaces of the oxide regions to form source and drain impurity areas.

In an embodiment, the oxide layers may be removed from the gate structure using an isotropic etch. The isotropic etch technique preferably involves using a wet etchant that exhibits high selectivity for the oxide regions without significant etching of the overlying mask, the gate conductor, or the second dielectric layer. A second impurity distribution may then be introduced into the semiconductor substrate to form source and drain impurity areas self-aligned with sidewall surfaces of the gate conductor. Following removal of the mask and the second dielectric layer, sidewall spacers may be formed laterally adjacent sidewall surfaces of the gate conductor. A refractory metal may then be deposited upon upper surfaces of the first dielectric layer and the gate conductor and reacted to form metal silicide layers.

In an alternative embodiment, the mask and portions of the second dielectric layer not underlying the gate structure may be removed following formation of the source and drain impurity areas. Vertical and lateral thicknesses of the oxide regions may then be selectively reduced to form spacers laterally adjacent the sidewalls of the gate conductor, and portions of the first dielectric layer not masked by the gate structure may be removed. Lightly doped drain impurity areas may then be formed self-aligned with sidewall surfaces of the gate conductor, and metal silicide layers may be formed upon upper surfaces of the semiconductor substrate above the source and drain impurity areas and upon the gate conductor.

The method as described herein has the advantage of forming ultra-small gate conductors by oxidizing a portion of a gate layer. In an embodiment, the oxide regions formed from the gate layer are removed. In an alternative embodiment, the oxide regions are etched to form spacers laterally adjacent sidewalls of the narrow gate conductor.

The method as described herein has the additional advantage of controlling the lateral dimension of lightly doped drain impurity areas formed adjacent the gate conductor by controlling the extent of oxidation of the gate layer. As described herein, lightly doped drain impurity areas are formed subsequent to formation of source and drain impurity areas. Varying the oxidation temperatures and durations may be used to increase the degree of oxidation of the gate layer, resulting in the formation of oxide regions having larger lateral dimensions. The remaining gate conductor will then be narrower, and the region of the semiconductor substrate between the source and drain impurity areas and the sidewalls of the gate conductor, which is occupied by the lightly doped drain impurity areas, will be increased.

BRIEF DESCRIPTION OF THE DRAWINGS

Other objects and advantages of the invention will become apparent upon reading the following detailed description and upon reference to the accompanying drawings in which.

Figure 1:
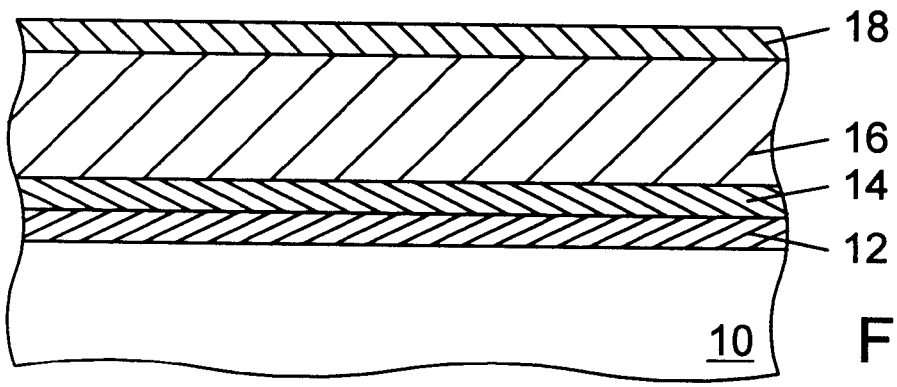
FIG. 1 is a cross-sectional view of a semiconductor topography in which a first dielectric layer, a second dielectric layer, a conductive gate material, and a masking layer are formed across a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, a first dielectric layer is formed upon an upper surface of a semiconductor substrate 10. Semiconductor substrate 10 may be a single crystalline substrate slightly doped with p-type or n-type dopant species. In an embodiment, first dielectric layer 12 may include thermally grown silicon dioxide. Alternatively, first dielectric layer 12 may include silicon dioxide formed by deposition from, e.g., a TEOS source or a silane- and oxygen-bearing source. A second dielectric layer may then be formed upon first dielectric layer 12. Preferably, second dielectric layer 14 exhibits etch characteristics dissimilar to those of first dielectric layer 12. For example, in an embodiment in which first dielectric layer 12 includes silicon dioxide, second dielectric layer 14 may include silicon nitride deposited from, e.g., a silane- and nitrogen-bearing source.

A conductive gate material may then formed upon second dielectric layer 14. Preferably, conductive gate material 16 includes polycrystalline silicon ("polysilicon") chemical-vapor deposited from, e.g., a silane source. A masking layer may be formed upon conductive gate material 16. In an embodiment, masking layer 18 exhibits etch characteristics similar to those of second dielectric layer 14. That is, an etch that selectively removes masking layer 18 from upon conductive gate material 16 preferably also will selectively remove second dielectric layer 14 from upon first dielectric layer 12. For example, both second dielectric layer 14 and masking layer 18 may include silicon nitride. Alternatively, masking layer 18 may include any dielectric material having a dielectric constant K greater than the K value of silicon dioxide and exhibiting etch characteristics dissimilar to those of silicon dioxide. In an alternative embodiment, masking layer 18 and second dielectric layer 14 exhibit etch characteristics dissimilar from each other as well as dissimilar from first dielectric layer 12.

Figure 2:
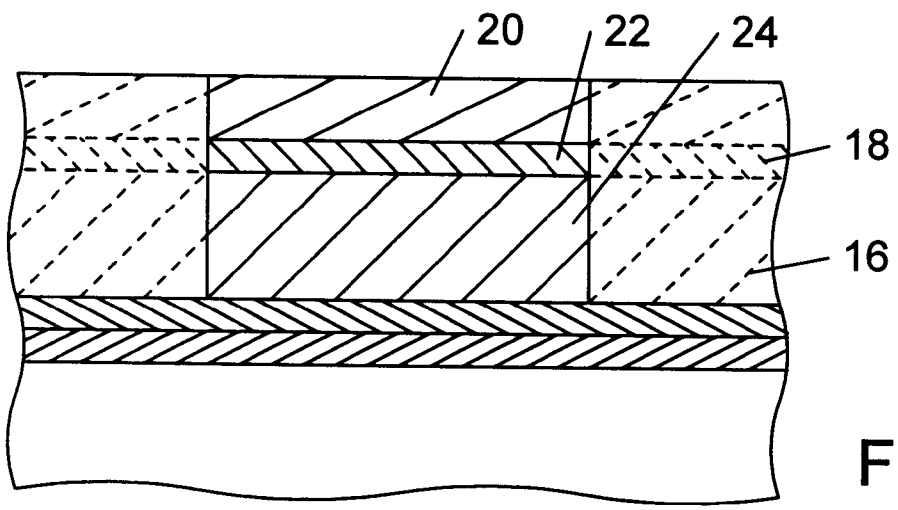
FIG. 2 is a cross-sectional view of the semiconductor topography subsequent to FIG. 1, wherein a photoresist layer is patterned upon the masking layer and wherein the masking layer and conductive gate material are selectively etched to form a gate structure including a mask configured upon a gate layer.
Figure 3:
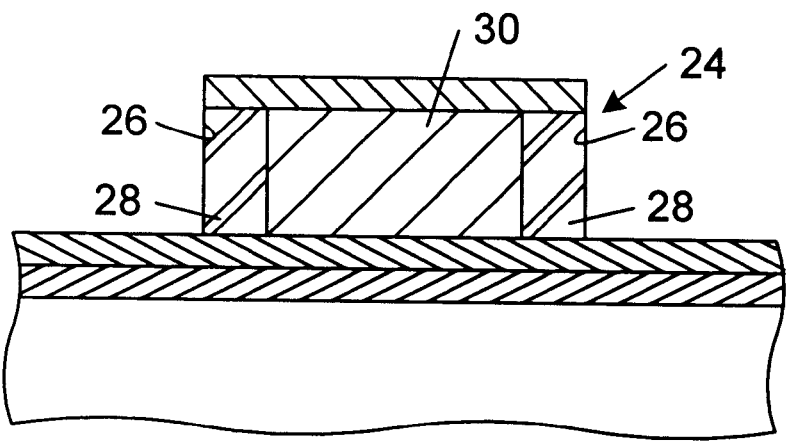
FIG. 3 is a cross-sectional view of the semiconductor topography subsequent to FIG. 2, wherein the gate layer is selectively oxidized to form a gate conductor laterally bounded by a pair of oxide regions.

FIG. 2 illustrates the formation of a photoresist pattern upon the masking layer. Photoresist 20 is preferably deposited using, e.g., chemical vapor deposition and selectively patterned and removed from above portions of the masking layer. Removed portions of photoresist are shown in phantom in FIG. 2. Portions of masking layer 18 and underlying portions of gate dielectric material 16 not masked by the remaining photoresist (also shown in phantom in FIG. 2) may be removed using, e.g., an anisotropic dry plasma to form mask 22 overlying gate structure 24. Subsequently, regions of gate structure 24 laterally adjacent sidewall surfaces 26 may be thermally oxidized to form oxide regions 28, as shown in FIG. 3. Preferably, mask 22 prevents oxygen from reaching an upper surface of gate structure 24. As a result, oxidation of gate structure 24 occurs only at lateral surfaces of gate structure 24 and not at the upper surface.

Figure 4:
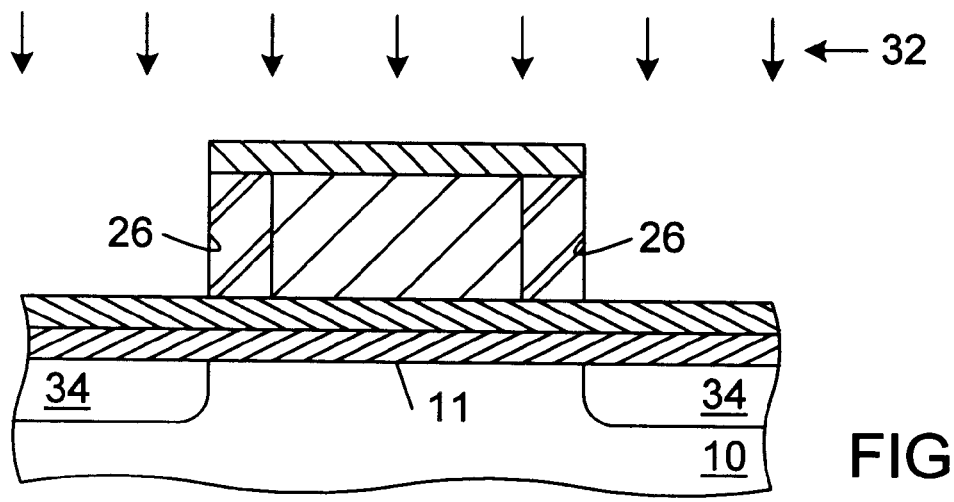
FIG. 4 is a cross-sectional view of the semiconductor topography subsequent to FIG. 3, wherein source and drain impurity areas are formed self-aligned to sidewall surfaces of the oxide regions.

Forming oxide regions 28 preferably comprises thermally oxidizing sidewall surfaces 26 of gate structure 24 at a temperature of greater than approximately 800° C. to form a thermal oxide. Remaining unoxidized portions of gate structure 24 then form gate conductor 30. First impurity distribution 32 may then be introduced into semiconductor substrate 10 to form source and drain impurity areas 34 self-aligned with sidewall surfaces 26 of the gate structure, as depicted in FIG. 4. In an embodiment, ion implantation is used to introduce first impurity distribution 32 into semiconductor substrate 10 at a first concentration and to a first depth below upper surface 11 of the semiconductor substrate.

Figure 5:
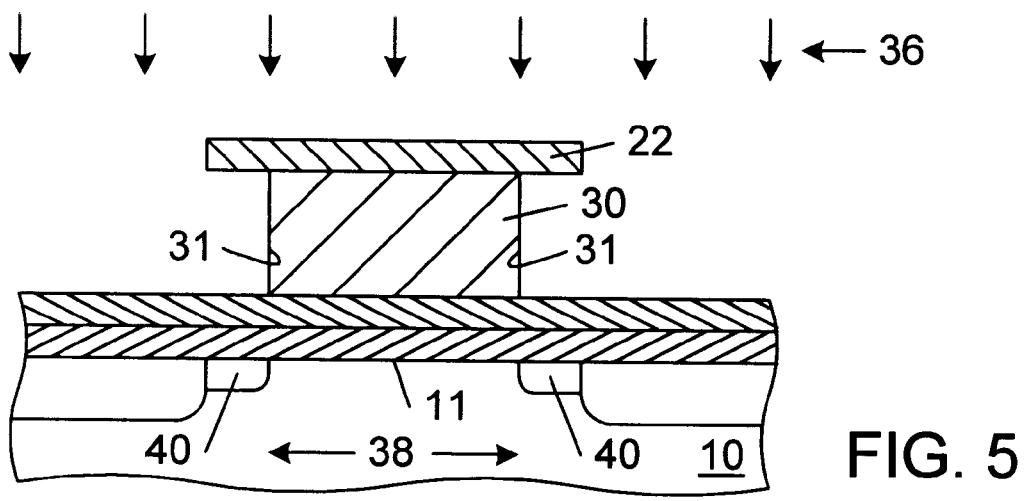
FIG. 5 is a cross-sectional view of the semiconductor topography subsequent to FIG. 4, wherein the oxide regions are removed and lightly doped drain impurity areas are formed self-aligned with sidewall surfaces of the gate conductor.

According to an embodiment of the present invention depicted in FIG. 5, an isotropic etch may be performed to substantially remove oxide regions 28. The isotropic etch technique preferably involves using a wet etchant that exhibits high selectivity for the oxide such that the oxide regions may be etched without significant etching of overlying mask 22 or gate conductor 30. In an embodiment in which mask 22 includes silicon nitride, the wet etchant may include hydrogen fluoride.

Following removal of the oxide regions, second impurity distribution 36 may be introduced into semiconductor substrate 10, as depicted in FIG. 5. Gate conductor 30 preferably serves as a mask to block introduction of second impurity distribution 36 into gate region 38 of semiconductor substrate 10. Lightly doped drain areas 40 are preferably formed in semiconductor substrate 10 self-aligned with sidewall surfaces 31 of gate conductor 30. In an embodiment, ion implantation is used to introduce second impurity distribution 36 into semiconductor substrate 10 at a second concentration less than the first concentration and to a second depth below upper surface 11 of the semiconductor substrate that is less than the first depth.

In an alternative embodiment, oxide regions 28 may be removed from sidewall surfaces of gate conductor 30 while omitting formation of source and drain impurity areas 34. Instead, source and drain impurity areas 34 may be formed concurrently with lightly doped drain impurity areas 40. For example, impurity ions may be forwarded into semiconductor substrate 10 using a high-energy implant such that ions are implanted, at a first depth and to a first concentration, into semiconductor substrate 10 self-aligned with sidewall surfaces of mask 22. Simultaneously, the impurity ions may be implanted into regions of semiconductor substrate 10 underlying portions of mask 22 extending laterally beyond sidewall surfaces of gate conductor 30 to form lightly doped drain impurity areas 40. Preferably, mask 22 partially blocks implantation of the impurity ions such that lightly doped drain impurity areas 40 are formed at a second depth less than the first depth and to a second concentration less than the first concentration.

Figure 6:
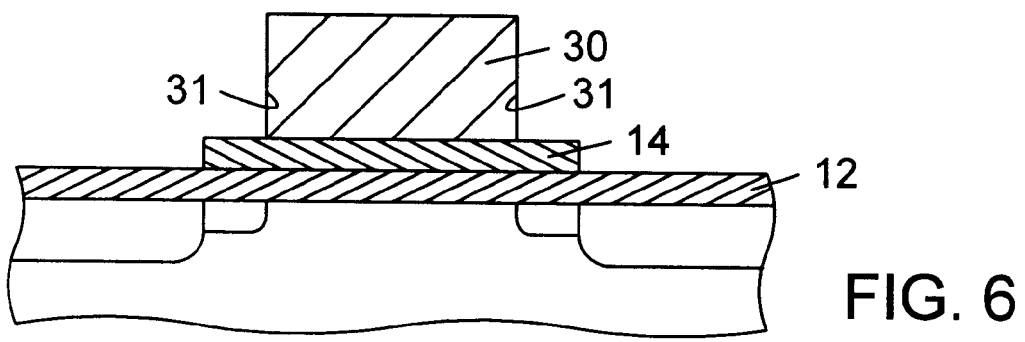
FIG. 6 is a cross-sectional view of the semiconductor topography subsequent to FIG. 5, wherein the mask is removed from upon the gate conductor and portions of the second dielectric layer not masked by the gate conductor are removed from upon the first dielectric layer.

Following formation of lightly doped drain impurity areas 40, mask 22 may be removed from upon gate conductor 30 and portions of second dielectric layer 14 may be removed from upon first dielectric layer 12. In the embodiment depicted in FIG. 6, in which second dielectric layer 14 and mask 22 include materials having substantially similar etch characteristics, an anisotropic plasma etch is used to selectively remove mask 22 and portions of second dielectric layer 14 laterally displaced from sidewall surfaces of gate conductor 30. Alternatively, a wet isotropic etch may be used to remove mask 22 and portions of second dielectric layer 14 aligned with sidewall surfaces 31 of gate conductor 30. In an embodiment in which both second dielectric layer 14 and mask 22 include silicon nitride, removal may be performed using a wet etch including phosphoric acid. In an embodiment in which second dielectric 14 and mask 22 have substantially dissimilar etch characteristics, mask 22 and second dielectric 14 may be removed sequentially using etch techniques selective for each material.

Figure 7:
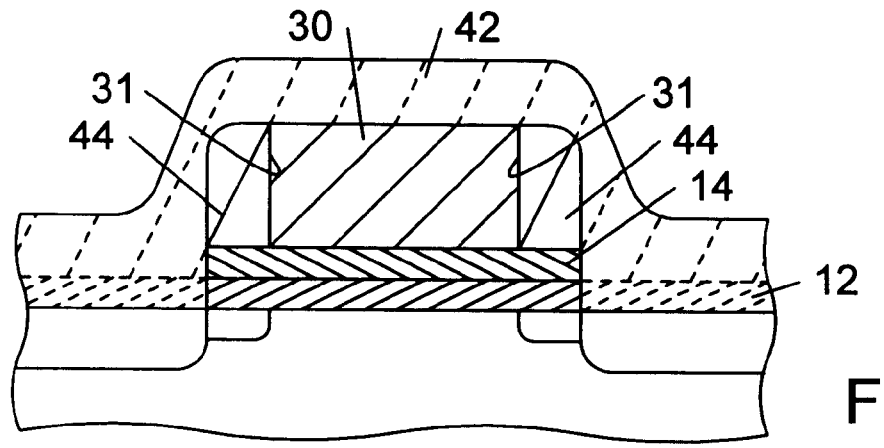
FIG. 7 is a cross-sectional view of the semiconductor topography subsequent to FIG. 6, wherein sidewall spacers are formed laterally adjacent the sidewall surfaces of the gate conductor.

Turning now to FIG. 7, a conformal dielectric 42 may be deposited across exposed surfaces of first dielectric layer 12, second dielectric layer 14, and gate conductor 30. An anisotropic etch then may be used to preferentially remove conformal dielectric 42 from substantially horizontal surfaces of the semiconductor topography while retaining the conformal dielectric on substantially vertical surfaces. The retained material preferably forms spacers 44 laterally adjacent sidewall surfaces 31 of gate conductor 30. In an embodiment, conformal dielectric 42 has etch characteristics similar to first dielectric 12. For example, both first dielectric 12 and conformal dielectric 42 may comprise silicon dioxide. As depicted in FIG. 7, the anisotropic etch removes portions of first dielectric layer 12 as well as conformal dielectric 42; removed portions are depicted in phantom. Alternatively, if conformal dielectric 42 and first dielectric layer 12 have substantially dissimilar etch characteristics, first dielectric layer 12 may be removed using a separate etch step either before or after formation of spacers 44.

Figure 8:
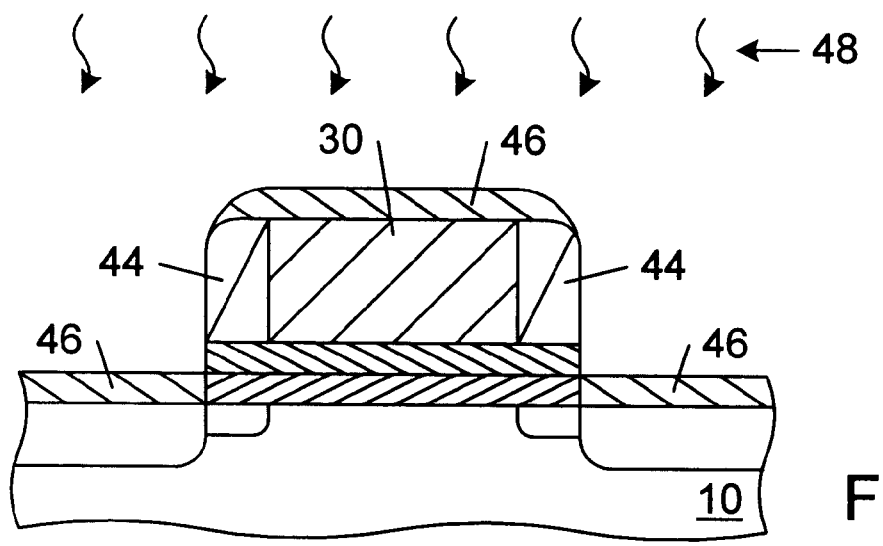
FIG. 8 is a cross-sectional view of the semiconductor topography subsequent to FIG. 7, wherein a refractory metal is deposited across the semiconductor topography.
Figure 9:
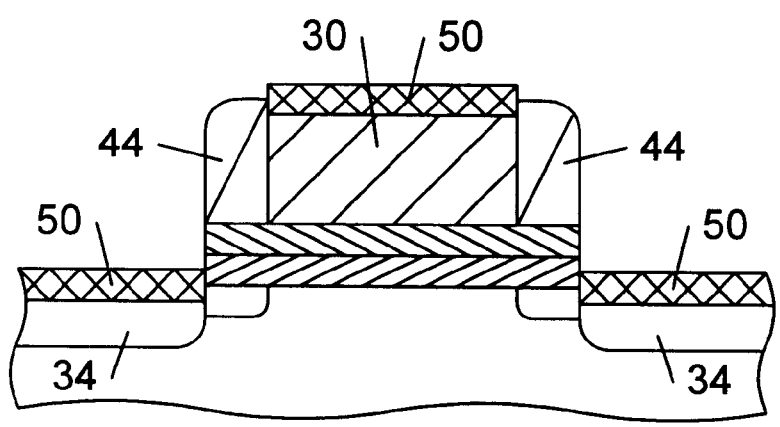
FIG. 9 is a cross-sectional view of the semiconductor topography subsequent to FIG. 8, wherein a metal silicide is formed upon upper surfaces of the gate conductor and the source and drain impurity areas.

Following spacer formation, a refractory metal (e.g., titanium or cobalt) may be formed across exposed upper surfaces of semiconductor substrate 10, gate conductor 30, and spacers 44, as shown in FIG. 8. Refractory metal 46 may be sputter deposited from a metal target such that it travels in a direction substantially perpendicular to horizontally oriented features. The deposited refractory metal may be exposed to a form of radiation, depicted by reference numeral 48 in FIG. 8, capable of increasing the temperature of the refractory metal to above, e.g., 600° C. The radiation may be thermal radiation provided from a heated furnace. Alternately, the radiation may be radiant light supplied from, e.g., an arc lamp or a tungsten-halogen lamp using a technique known as rapid thermal processing ("RTP"). The use of RTP to heat the refractory metal may reduce the amount of unwanted dopant diffusion into the semiconductor topography as compared to using a high-temperature furnace. Raising the temperature of the refractory metal serves to initiate reaction between metal atoms and silicon atoms of semiconductor substrate 10 and gate conductor 30. Any unreacted refractory metal that remains may be etched away using, e.g., a wet etch highly selective to the metal. The resulting metal silicide 50, shown in FIG. 9, has a relatively low resistivity and serves as a self-aligned contact region across source and drain areas 34 and gate conductor 30. Absent refractory metal upon the lower portions of spacers 44, no silicide formation occurs at those portions. Consequently, silicide bridging between gate conductor 30 and source and drain areas 34 is less likely to occur.

Figure 10:
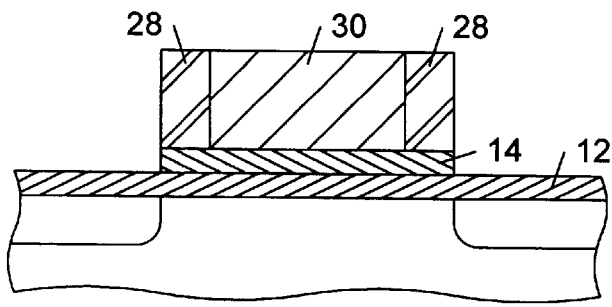
FIG. 10 is a cross-sectional view of the semiconductor topography subsequent to FIG. 4 according to an alternate embodiment, wherein the mask and portions of the first dielectric layer not masked by the gate conductor are removed from the semiconductor topography.

In an alternative embodiment shown in FIG. 10, following formation of oxide regions 28 and gate conductor 30, as depicted in FIG. 4, mask 22 and portions of second dielectric layer 14 not masked by gate structure 24 may be removed. Removal may be accomplished similarly to the method as previously described for FIG. 6. That is, in an embodiment in which second dielectric layer 12 and mask 22 include materials having substantially similar etch characteristics, an anisotropic plasma etch may be used to selectively remove mask 22 and portions of second dielectric layer 12. Alternatively, a wet isotropic etch may be used. In an embodiment in which both second dielectric layer 12 and mask 22 include silicon nitride, the wet etch may include phosphoric acid. In an embodiment in which second dielectric 12 and mask 22 have substantially dissimilar etch characteristics, mask 22 and second dielectric 12 may be removed sequentially using etch techniques selective for each material.

Figure 11:
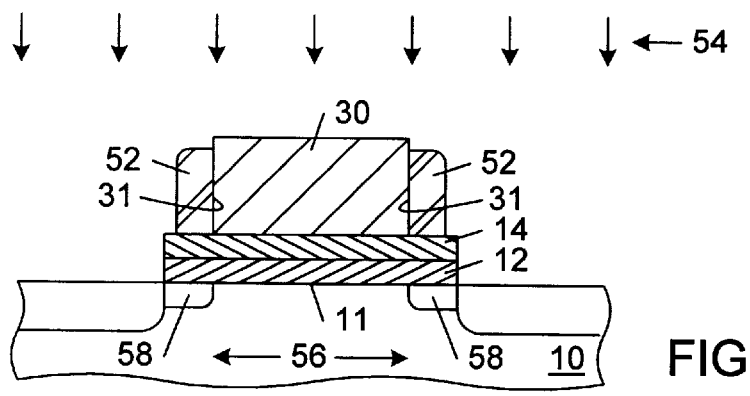
FIG. 11 is a cross-sectional view of the semiconductor topography subsequent to FIG. 10, wherein the first dielectric layer and portions of the oxide regions are removed.

Turning now to FIG. 11, an etch may be used to reduce the vertical dimension of oxide regions 28, forming spacers 52. In an embodiment depicted in FIG. 11, an isotropic wet etch is used such that spacers 52 are reduced in lateral as well as vertical dimensions over oxide regions 28. In an embodiment in which oxide regions 28 include silicon dioxide, the wet etchant may include hydrogen fluoride. If first dielectric layer 12 possesses etch characteristics substantially similar to oxide regions 28, portions of first dielectric 12 not masked by second gate dielectric 14 may be removed simultaneously with formation of spacers 52. Alternatively, if etch characteristics of oxide regions 28 and first dielectric layer 12 are dissimilar, first dielectric layer 12 may be removed following formation of spacers 52 using an appropriate wet or dry etch. As a further alternative, first dielectric layer 12 may be retained upon semiconductor substrate 10.

Following formation of spacers 52, second impurity distribution 54 may be introduced into semiconductor substrate 10 in regions laterally displaced from gate conductor 30. Gate conductor 30 preferably serves as a mask to block introduction of second impurity distribution 54 into gate region 56 of semiconductor substrate 10. Lightly doped drain areas 58 are preferably formed in semiconductor substrate 10 self-aligned with sidewall surfaces 31 of gate conductor 30. In an embodiment, ion implantation is used to introduce second impurity distribution 54 into semiconductor substrate 10 at a second concentration less than the first concentration and to a second depth below upper surface 11 of the semiconductor substrate that is less than the first depth.

In an alternative embodiment, source and drain impurity areas 54 may be formed concurrently with lightly doped drain impurity areas 58. For example, impurity ions may be forwarded into semiconductor substrate 10 using a high-energy implant such that ions are implanted, at a first depth and to a first concentration, into semiconductor substrate 10 self-aligned with sidewall surfaces of oxide regions 28.

Simultaneously, the impurity ions may be implanted into regions of semiconductor substrate 10 underlying portions of oxide regions 28 to form lightly doped drain impurity areas 58. Preferably, oxide regions 28 and first and second dielectric layers 12 and 14 partially block implantation of the impurity ions such that lightly doped drain impurity areas 58 are formed at a second depth less than the first depth and to a second concentration less than the first concentration. In a further alternative embodiment, oxide regions 28 may etched to form spacers 52 prior to simultaneously forming source and drain impurity areas 34 and source and drain impurity areas 58.

Figure 12:
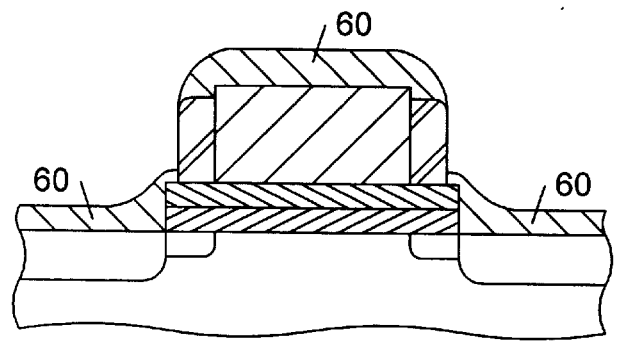
FIG. 12 is a cross-sectional view of the semiconductor topography subsequent to FIG. 11, wherein a refractory metal is deposited across the semiconductor topography.
Figure 13:
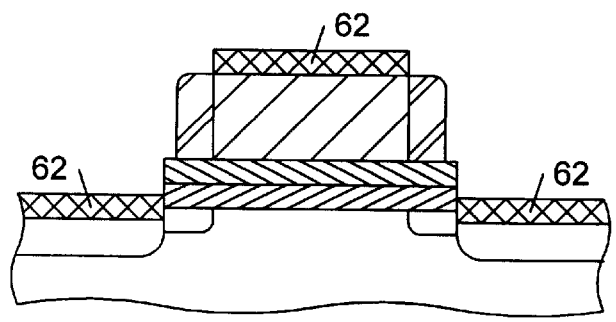
FIG. 13 is a cross-sectional view of the semiconductor topography subsequent to FIG. 12, wherein a metal silicide is formed upon upper surfaces of the gate conductor and the source and drain regions.

As depicted in FIG. 12, a refractory metal (e.g., titanium or cobalt) may be formed across exposed upper surfaces of semiconductor substrate 10, first and second gate dielectric 12 and 14, spacers 52, and gate conductor 30. Refractory metal 60 may be deposited and reacted in a manner similar to that described for FIGS. 8–9 to form metal silicide 62, shown in FIG. 13.

It will be appreciated to those skilled in the art having the benefit of this disclosure that this invention is believed to provide a method for forming a transistor having an ultra short channel length. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a transistor upon and within a semiconductor substrate, comprising:
    patterning a layer of nitride directly above a layer of silicon-based gate conductor;
    while maintaining said layer of nitride, oxidizing a portion of the silicon-based gate conductor;
    removing the oxidized portion of the silicon-based gate conductor;
    implanting at least a portion of a junction area within the semiconductor substrate having lateral extents aligned with the patterned nitride and the silicon-based gate conductor after said removing step;
    removing the layer of nitride; and
    forming metal suicides upon upper surfaces of the gate conductor and the junction area.

2. The method as recited in claim 1, wherein said oxidizing comprises exposing said silicon-based gate conductor exclusive of said layer of nitride to an oxygen-bearing ambient.

3. The method as recited in claim 1, wherein said implanting comprises forwarding a source and drain implant aligned with said patterned nitride after said removing step and before forwarding a lightly doped drain implant aligned with the silicon-based gate conductor.

4. A method for forming a transistor, comprising:
    providing, in order upon a semiconductor substrate, a first dielectric layer, a second dielectric layer, a conductive gate material, and a masking layer;
    selectively removing portions of said masking layer and said conductive gate material to form a gate structure, wherein said gate structure comprises a gate layer with a mask configured upon an upper surface of said gate layer;
    while maintaining said mask, oxidizing portions of said gate layer to form a gate conductor laterally bounded by a pair of oxide regions;
    introducing impurities into the semiconductor substrate to form source and drain regions;
    removing the mask from the upper surface of the gate conductor; and
    forming metal silicides upon upper surfaces of the gate conductor and the source and drain regions.

5. The method as recited in claim 4, wherein providing said first dielectric layer comprises thermally growing silicon dioxide upon said semiconductor substrate, said semiconductor substrate comprising single crystalline silicon.

6. The method as recited in claim 4, wherein providing said first dielectric layer comprises chemical vapor depositing silicon dioxide upon said semiconductor substrate.

7. The method as recited in claim 4, wherein providing said second dielectric layer comprises chemical vapor depositing silicon nitride upon said first dielectric layer.

8. The method as recited in claim 4, wherein providing said conductive gate layer comprises chemical vapor depositing polycrystalline silicon upon said second dielectric layer.

9. The method as recited in claim 4, wherein providing said masking layer comprises chemical vapor depositing upon said conductive gate layer a material having a dielectric constant greater than a dielectric constant of silicon dioxide.

10. The method as recited in claim 4, wherein providing said masking layer comprises chemical vapor depositing upon said conductive gate layer a material having etch characteristics substantially similar to etch characteristics of said second dielectric layer.

11. The method as recited in claim 4, wherein providing said masking layer comprises chemical vapor depositing silicon nitride upon said conductive gate layer.

12. The method as recited in claim 4, wherein said introducing impurities comprises:
    introducing a first impurity distribution at a first impurity concentration into source and drain regions of said semiconductor substrate to form source and drain impurity areas self-aligned with sidewalls of said gate structure;
    removing said oxide regions; and
    introducing a second impurity distribution at a second concentration less than said first concentration into said source and drain regions to form lightly doped drain impurity areas self-aligned with sidewalls of said gate conductor.

13. The method as recited in claim 12, wherein introducing said first impurity distribution comprises ion implanting a first impurity species into said semiconductor substrate.

14. The method as recited in claim 12, wherein removing said oxide regions comprises isotropically etching said oxide regions using a wet etch.

15. The method as recited in claim 14, wherein said wet etch comprises hydrogen fluoride.

16. The method as recited in claim 12, wherein introducing said second impurity distribution comprises ion implanting a second impurity species into said semiconductor substrate.

17. The method as recited in claim 12, further comprising removing portions of said second dielectric layer from regions of said semiconductor substrate not masked by said gate conductor.

18. The method as recited in claim 17, wherein said mask and said portions of said second dielectric layer are removed substantially simultaneously.

19. The method as recited in claim 17, wherein removing said mask and removing said portions of said second dielectric layer comprise anisotropically etching said mask and said second dielectric layer.

20. The method as recited in claim 4, wherein said introducing impurities comprises:

introducing a first impurity distribution at a first impurity concentration into source and drain regions of said semiconductor substrate to form source and drain impurity areas self-aligned with sidewalls of said gate structure;

removing portions of said second dielectric layer not masked by said gate structure; and removing portions of said oxide regions to form a pair of sidewall spacers.

21. The method as recited in claim 20, wherein said mask is removed from above said gate structure substantially simultaneously with removing said portions of said second dielectric layer not masked by said gate structure.

22. The method as recited in claim 20, further comprising introducing a second impurity distribution at a second concentration less than said first concentration into said source and drain regions to form lightly doped drain impurity areas self-aligned with sidewalls of said gate conductor.

23. The method as recited in claim 20, wherein removing said mask and removing said portions of said second dielectric layer comprise anisotropically etching said mask and said second dielectric layer.

24. The method as recited in claim 20, wherein removing portions of said oxide regions comprises isotropically etching said oxide regions using a wet etch.

25. The method as recited in claim 24, wherein said wet etch comprises hydrogen fluoride.

26. A method for forming a transistor, comprising:

forming a mask aligned upon a conductive gate structure, wherein the conductive gate structure is defined a dielectric-spaced distance above a semiconductor substrate;

while maintaining said mask, oxidizing portions of said conductive gate structure to form a gate conductor laterally bounded by a pair of oxide regions;

implanting impurity ions into said semiconductor substrate to concurrently form source and drain impurity areas self-aligned with sidewall surfaces of said mask and lightly doped drain impurity areas self-aligned with sidewall surfaces of said gate conductor;

removing the mask from the gate conductor; and forming metal silicides upon upper surfaces of the gate conductor and the source and drain impurity areas.

* * * * *

UNITED STATES PATENT AND TRADEMARK OFFICE
CERTIFICATE OF CORRECTION

PATENT NO. : 5,989,967
DATED : November 23, 1999
INVENTOR(S) : Gardner, et. al.

It is certified that error appears in the above-identified patent and that said Letters Patent is hereby corrected as shown below:

Claim 1, col. 9, line 45, please delete "suicides" and substitute --silicides--.

Signed and Sealed this

Thirtieth Day of May, 2000

Q. TODD DICKINSON

Attest:

*Attesting Officer*    *Director of Patents and Trademarks*